(12) United States Patent
Takuma et al.

(10) Patent No.: US 12,218,124 B2
(45) Date of Patent: Feb. 4, 2025

(54) GATE CONTROL CIRCUIT, SEMICONDUCTOR DEVICE, ELECTRONIC APPARATUS, AND VEHICLE

(71) Applicant: ROHM Co., LTD., Kyoto (JP)

(72) Inventors: Toru Takuma, Kyoto (JP); Adrian Joita, Kyoto (JP); Shuntaro Takahashi, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 279 days.

(21) Appl. No.: 18/049,731

(22) Filed: Oct. 26, 2022

(65) Prior Publication Data

US 2023/0133872 A1 May 4, 2023

(30) Foreign Application Priority Data

Oct. 28, 2021 (JP) .................. 2021-176335

(51) Int. Cl.
| | | |
|---|---|---|
| H03K 17/06 | (2006.01) | |
| H01L 27/02 | (2006.01) | |
| H01L 29/78 | (2006.01) | |
| H02M 3/156 | (2006.01) | |
| H03K 17/082 | (2006.01) | |
| H03K 19/0185 | (2006.01) | |
| H02M 1/08 | (2006.01) | |

(52) U.S. Cl.
CPC ...... *H01L 27/0255* (2013.01); *H01L 29/7808* (2013.01); *H02M 3/156* (2013.01); *H03K 17/063* (2013.01); *H03K 17/0822* (2013.01); *H03K 19/018521* (2013.01); *H02M 1/08* (2013.01)

(58) Field of Classification Search
CPC ....... H03K 17/04106; H03K 17/04123; H03K 17/04163; H03K 17/0822; H03K 19/018521; H03K 17/063; H02M 1/08–088
See application file for complete search history.

(56) References Cited

U.S. PATENT DOCUMENTS 6,320,275 B1 * 11/2001 Okamoto .................. B60L 3/04
361/31
9,787,180 B2 * 10/2017 Illing .................... H02M 3/156
(Continued)

FOREIGN PATENT DOCUMENTS

JP      2024060182 A  *  5/2024
WO   WO2017/187785     12/2018

*Primary Examiner* — Sisay G Tiku
(74) *Attorney, Agent, or Firm* — CHIP LAW GROUP

(57) ABSTRACT

Disclosed is a gate control circuit that generates a gate control signal of an output transistor connected between an application end of a power supply voltage and an application end of an output voltage. The gate control circuit includes a first current source connected between the application end of the power supply voltage and the application end of the output voltage, a second current source connected between an application end of a booster voltage and an application end of a reference voltage, the booster voltage being raised to a voltage value higher than the power supply voltage in a steady state, an output stage that uses at least one of the first and second current sources to generate a gate charge current for charging a gate of the output transistor, and a controller that uses at least one of the first and second current sources according to the output voltage.

11 Claims, 9 Drawing Sheets

(56) References Cited

U.S. PATENT DOCUMENTS

| | | | | |
|---|---|---|---|---|
| 2018/0048140 A1* | 2/2018 | Takuma | ............... | H02H 9/025 |
| 2019/0190512 A1* | 6/2019 | Takuma | ............... | H02H 3/243 |
| 2020/0251894 A1* | 8/2020 | Takuma | ............... | G06F 1/305 |
| 2020/0403393 A1* | 12/2020 | Takuma | ............... | H02H 7/20 |
| 2022/0109439 A1* | 4/2022 | Takuma | ............... | H02H 3/243 |
| 2022/0158436 A1* | 5/2022 | Takuma | ............... | H02H 3/08 |
| 2023/0102188 A1* | 3/2023 | Takuma | ............... | H03F 3/347 |
| | | | | 330/298 |
| 2023/0223746 A1* | 7/2023 | Joita | ............ | H02H 3/08 |
| | | | | 361/56 |
| 2024/0235190 A1* | 7/2024 | Takahashi | ............ | H01L 29/78 |

* cited by examiner

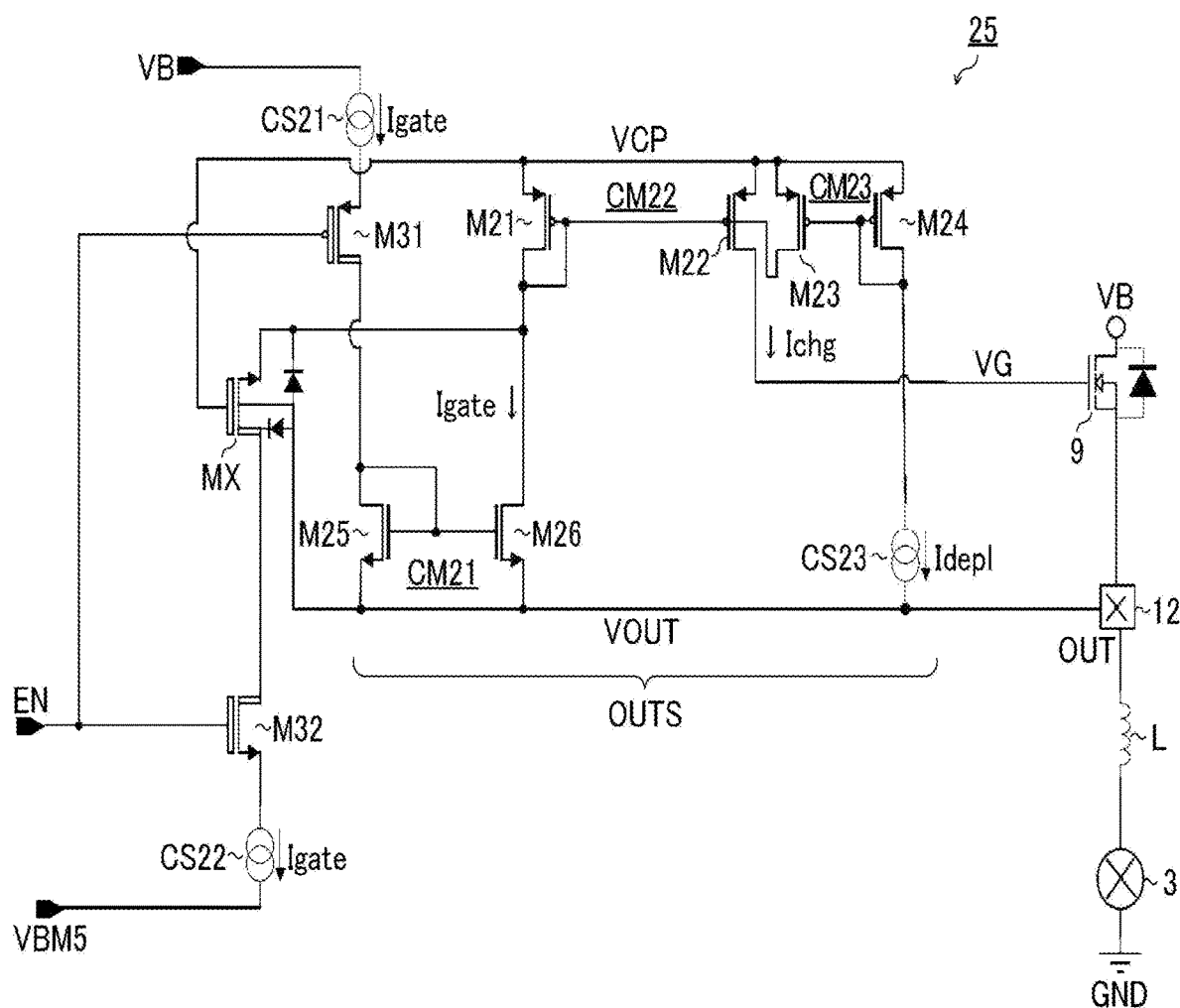
F I G . 8

GATE CONTROL CIRCUIT, SEMICONDUCTOR DEVICE, ELECTRONIC APPARATUS, AND VEHICLE

CROSS REFERENCE TO RELATED APPLICATIONS

This application claims priority benefit of Japanese Patent Application No. JP 2021-176335 filed in the Japan Patent Office on Oct. 28, 2021. Each of the above-referenced applications is hereby incorporated herein by reference in its entirety.

BACKGROUND

The technology disclosed in the present specification relates to a gate control circuit and to a semiconductor device, an electronic apparatus, and a vehicle with the gate control circuit.

The applicant of the present application has proposed a large number of new techniques related to semiconductor devices such as an in-vehicle intelligent power device (IPD) (for example, see PCT Patent Publication No. WO2017/187785).

Examples of a technique related to a gate control circuit incorporated into a semiconductor device include U.S. Pat. No. 9,787,180.

SUMMARY

However, the gate control circuit in the related art still has room for improvement in gate control between different voltage domains.

Particularly, it has been demanded in recent years that an in-vehicle integrated circuit (IC) follow ISO 26262 (international standard for functional safety related to electrical and/or electronic systems in vehicles), and the design with higher reliability is also important for the in-vehicle IPD.

In view of the problem found out by the inventors of the present applicant, it is desirable to provide a gate control circuit that can perform appropriate gate control between different voltage domains and to provide a semiconductor device, an electronic apparatus, and a vehicle with the gate control circuit.

For example, a gate control circuit disclosed in the present specification generates a gate control signal of an output transistor connected between an application end of a power supply voltage and an application end of an output voltage. The gate control circuit includes a first current source connected between the application end of the power supply voltage and the application end of the output voltage, a second current source connected between an application end of a booster voltage and an application end of a reference voltage, the booster voltage being raised to a voltage value higher than the power supply voltage in a steady state, an output stage that uses at least one of the first current source and the second current source to generate a gate charge current for charging a gate capacitance of the output transistor, and a controller that uses at least one of the first current source and the second current source according to the output voltage.

Other features, elements, steps, advantages, and characteristics will become more apparent from the following detailed description of preferred embodiments and the attached drawings related to the embodiments.

According to the technology disclosed in the present specification, a gate control circuit that can perform appropriate gate control between different voltage domains can be provided, and a semiconductor device, an electronic apparatus, and a vehicle with the gate control circuit can be provided.

BRIEF DESCRIPTION OF THE DRAWINGS

FIG. 8 depicts a fourth embodiment of the gate control circuit;

DETAILED DESCRIPTION OF THE PREFERRED EMBODIMENTS

Electronic Apparatus

Figure 1:
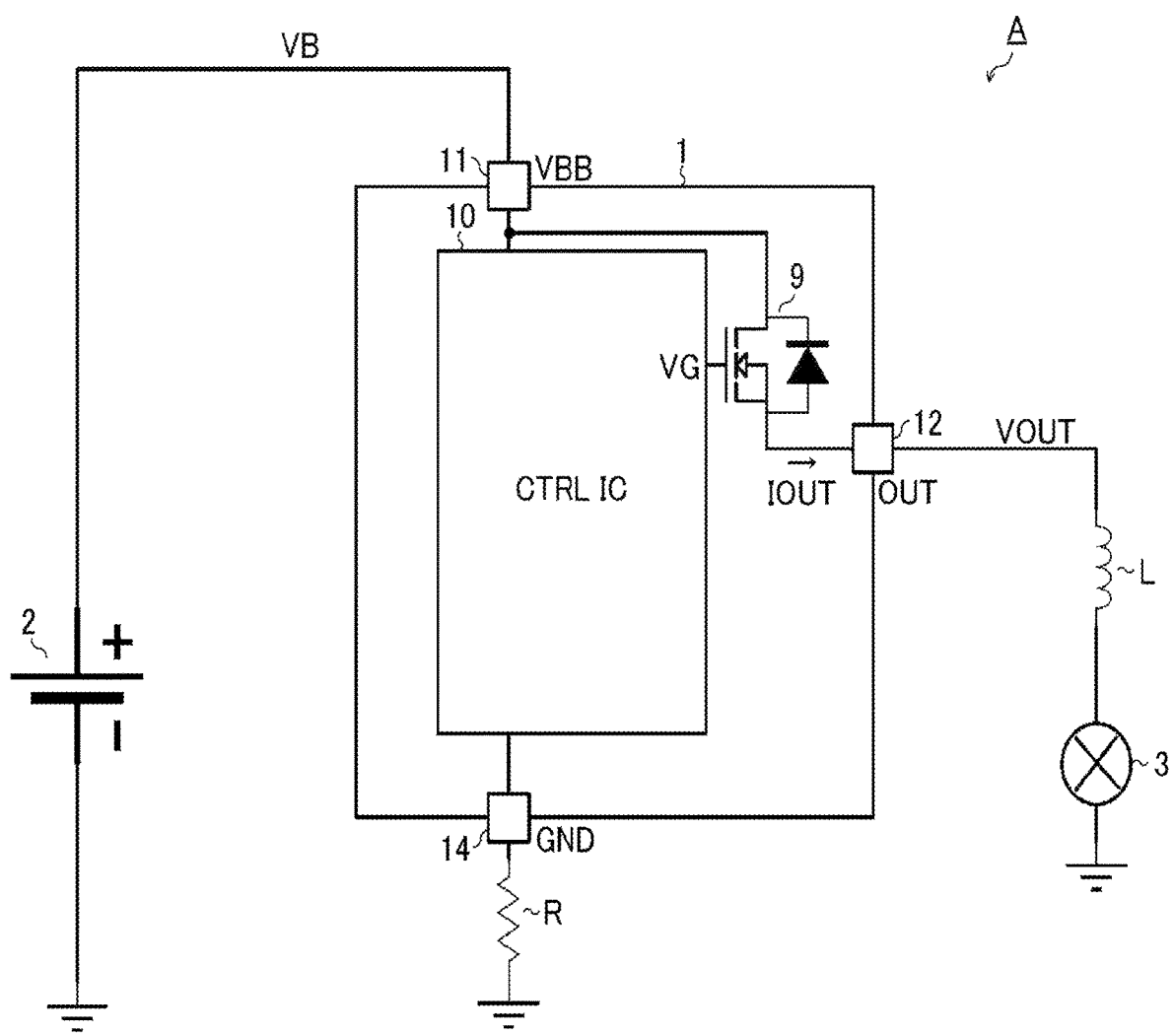
FIG. 1 depicts a configuration example of an electronic apparatus including a semiconductor device.

FIG. 1 depicts a configuration example of an electronic apparatus including a semiconductor device. An electronic apparatus A of the present configuration example includes a semiconductor device 1, a direct-current (DC) power supply 2, and a load 3.

The semiconductor device 1 is a high side switch IC (type of IPD) that electrically connects and disconnects the DC power supply 2 and the load 3, and the semiconductor device 1 includes a power metal insulator semiconductor field effect transistor (MISFET) 9 and a control IC 10 that are integrated.

The semiconductor device 1 also includes a plurality of external electrodes as a section for establishing electrical connection with an outside of the device. As illustrated in FIG. 1, the semiconductor device 1 includes a drain electrode 11 (=corresponding to power supply electrode VBB), a source electrode 12 (=corresponding to output electrode OUT), and a reference voltage electrode 14 (=corresponding to ground electrode GND).

The power MISFET 9 is an example of an insulated gate power transistor (=output transistor), and the power MISFET 9 functions as a high side switch element that electrically connects and disconnects the drain electrode 11 and the source electrode 12.

The control IC 10 includes a plurality of types of functional circuits that realize various functions. For example, the plurality of types of functional circuits include a circuit that generates a gate control signal VG for controlling the drive of the power MISFET 9 according to an electrical signal from the outside.

The drain electrode 11 transmits a power supply voltage VB to a drain of the power MISFET 9 and various circuits of the control IC 10. The source electrode 12 is connected to a source of the power MISFET 9 and transmits an output voltage VOUT and an output current IOUT to the load 3. Note that a signal line (for example, wire harness) placed between the source electrode 12 and the load 3 is generally accompanied by an inductance component L (and resistance component). An input electrode 13 transmits an input voltage (=input signal IN) for driving the control IC 10. The reference voltage electrode 14 transmits a reference voltage (for example, ground voltage GND) to the control IC 10. Note that a part between the reference voltage electrode 14 and a ground end is generally accompanied by a resistance component R.

Semiconductor Device

Figure 2:
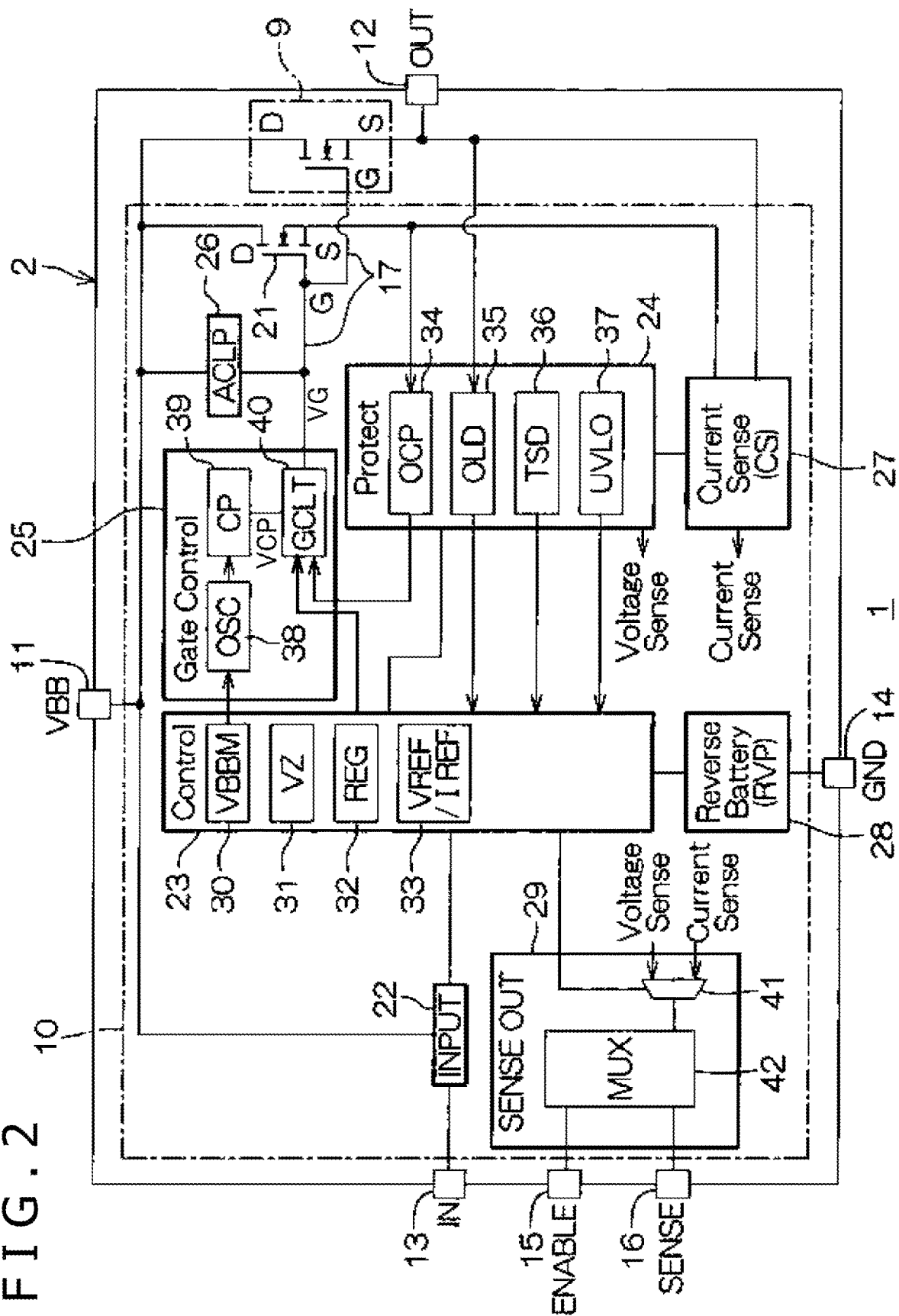
FIG. 2 is a block circuit diagram illustrating an electrical structure of the semiconductor device.

FIG. 2 is a block circuit diagram illustrating an electrical structure of the semiconductor device 1 illustrated in FIG. 1. The semiconductor device 1 is mounted on a vehicle in the example described below. Note that the semiconductor device 1 can be applied as a high side switch for controlling conduction to a light source, such as a bulb lamp and a light emitting diode (LED) lamp, or other types of electronic control devices when the semiconductor device 1 is mounted on the vehicle.

The semiconductor device 1 includes the drain electrode 11, the source electrode 12, the input electrode 13, the reference voltage electrode 14, an enable electrode 15, a sense electrode 16, gate control wiring 17, the power MISFET 9, and the control IC 10.

The drain electrode 11 (=power supply electrode VBB) is connected to the DC power supply 2. The drain electrode 11 provides the power supply voltage VB to the power MISFET 9 and the control IC 10. The power supply voltage VB may be equal to or greater than 10 V but equal to or smaller than 20 V. Meanwhile, the source electrode 12 (=output electrode OUT) is connected to the load 3.

The input electrode 13 (=input electrode IN) may be connected to a micro controller unit (MCU), a DC/DC converter, a low drop out (LDO) regulator, and other elements. The input electrode 13 provides an input voltage to the control IC 10. The input voltage may be equal to or greater than 1 V but equal to or smaller than 10 V. The reference voltage electrode 14 is connected to reference voltage wiring (ground end). The reference voltage electrode 14 provides a reference voltage to the power MISFET 9 and the control IC 10.

The enable electrode 15 may be connected to the MCU. An electrical signal for enabling or disabling part or all of the functions of the control IC 10 is input to the enable electrode 15. The sense electrode 16 transmits an electrical signal for detecting an abnormality of the control IC 10 to the outside of the device. Note that the sense electrode 16 may be pulled up or pulled down by a resistor.

A gate of the power MISFET 9 is connected to the control IC 10 (gate control circuit 25 described later) through the gate control wiring 17. The drain of the power MISFET 9 is connected to the drain electrode 11. The source of the power MISFET 9 is connected to the control IC 10 (current detection circuit 27 described later) and the source electrode 12.

The control IC 10 includes a sensor MISFET 21, an input circuit 22, a current-voltage control circuit 23, a protection circuit 24, the gate control circuit 25, an active clamp circuit 26, the current detection circuit 27, a power supply reverse connection protection circuit 28, and an abnormality detection circuit 29.

A gate of the sensor MISFET 21 is connected to the gate control circuit 25. A drain of the sensor MISFET 21 is connected to the drain electrode 11. A source of the sensor MISFET 21 is connected to the current detection circuit 27.

The input circuit 22 is connected to the input electrode 13 and the current-voltage control circuit 23. The input circuit 22 may include a Schmitt trigger circuit. The input circuit 22 shapes a waveform of an electrical signal applied to the input electrode 13. A signal generated by the input circuit 22 is input to the current-voltage control circuit 23.

The current-voltage control circuit 23 is connected to the protection circuit 24, the gate control circuit 25, the power supply reverse connection protection circuit 28, and the abnormality detection circuit 29. The current-voltage control circuit 23 may include a logic circuit.

The current-voltage control circuit 23 generates various voltages according to electrical signals from the input circuit 22 and electrical signals from the protection circuit 24. The current-voltage control circuit 23 in this mode includes a drive voltage generation circuit 30, a first constant voltage generation circuit 31, a second constant voltage generation circuit 32, and a reference voltage and reference current generation circuit 33.

The drive voltage generation circuit 30 generates a drive voltage for driving the gate control circuit 25. The drive voltage may be set to a value obtained by subtracting a predetermined value from the power supply voltage VB. The drive voltage generation circuit 30 may subtract 5 V from the power supply voltage VB to generate a drive voltage of equal to or greater than 5 V but equal to or smaller than 15 V. The drive voltage is input to the gate control circuit 25.

The first constant voltage generation circuit 31 generates a first constant voltage for driving the protection circuit 24. The first constant voltage generation circuit 31 may include a Zener diode or a regulator circuit (here, Zener diode). The first constant voltage may be equal to or greater than 1 V but equal to or smaller than 5 V. The first constant voltage is input to the protection circuit 24 (more specifically, load open detection circuit 35 and other circuits described later).

The second constant voltage generation circuit 32 generates a second constant voltage for driving the protection circuit 24. The second constant voltage generation circuit 32 may include a Zener diode or a regulator circuit (here, regulator circuit). The second constant voltage may be equal to or greater than 1 V but equal to or smaller than 5 V. The second constant voltage is input to the protection circuit 24 (more specifically, overheat protection circuit 36 and low voltage malfunction suppression circuit 37 described later).

The reference voltage and reference current generation circuit 33 generates a reference voltage and a reference current of various circuits. The reference voltage may be equal to or greater than 1 V but equal to or smaller than 5 V. The reference current may be equal to or greater than 1 mA but equal to or smaller than 1 A. The reference voltage and the reference current are input to various circuits. When the various circuits include a comparator, the reference voltage and the reference current may be input to the comparator.

The protection circuit 24 is connected to the current-voltage control circuit 23, the gate control circuit 25, the abnormality detection circuit 29, the source of the power MISFET 9, and the source of the sensor MISFET 21. The protection circuit 24 includes an overcurrent protection circuit 34, the load open detection circuit 35, the overheat protection circuit 36, and the low voltage malfunction suppression circuit 37.

The overcurrent protection circuit 34 protects the power MISFET 9 from an overcurrent. The overcurrent protection circuit 34 is connected to the gate control circuit 25 and the source of the sensor MISFET 21. The overcurrent protection circuit 34 may include a current monitor circuit. A signal generated by the overcurrent protection circuit 34 is input to the gate control circuit 25 (more specifically, drive signal output circuit 40 described later).

The load open detection circuit 35 detects a short-circuit state and an open state of the power MISFET 9. The load open detection circuit 35 is connected to the current-voltage control circuit 23 and the source of the power MISFET 9. A signal generated by the load open detection circuit 35 is input to the current-voltage control circuit 23.

The overheat protection circuit 36 monitors a temperature of the power MISFET 9 and protects the power MISFET 9 from an excessive rise in temperature. The overheat protection circuit 36 is connected to the current-voltage control circuit 23. The overheat protection circuit 36 may include a temperature sensitive device, such as a temperature sensitive diode or a thermistor. A signal generated by the overheat protection circuit 36 is input to the current-voltage control circuit 23.

The low voltage malfunction suppression circuit 37 suppresses a malfunction of the power MISFET 9 when the power supply voltage VB is smaller than a predetermined value. The low voltage malfunction suppression circuit 37 is connected to the current-voltage control circuit 23. A signal generated by the low voltage malfunction suppression circuit 37 is input to the current-voltage control circuit 23.

The gate control circuit 25 controls an on-state and an off-state of the power MISFET 9 and an on-state and an off-state of the sensor MISFET 21. The gate control circuit 25 is connected to the current-voltage control circuit 23, the protection circuit 24, the gate of the power MISFET 9, and the gate of the sensor MISFET 21.

The gate control circuit 25 outputs a gate control signal VG to the gate control wiring 17 according to an electrical signal from the current-voltage control circuit 23 and an electrical signal from the protection circuit 24. The gate control signal VG is input to each of the gate of the power MISFET 9 and the gate of the sensor MISFET 21 through the gate control wiring 17. Specifically, the gate control circuit 25 controls the gate control signal VG according to the electrical signal (input signal IN) applied to the input electrode 13, to turn on/off the power MISFET 9.

More specifically, the gate control circuit 25 includes an oscillation circuit 38, a charge pump circuit 39, and the drive signal output circuit 40. The oscillation circuit 38 oscillates according to the electrical signal from the current-voltage control circuit 23 and generates a predetermined electrical signal. The electrical signal generated by the oscillation circuit 38 is input to the charge pump circuit 39. The charge pump circuit 39 generates a booster voltage VCP according to the electrical signal from the oscillation circuit 38. The booster voltage VCP generated by the charge pump circuit 39 is input to the drive signal output circuit 40.

The drive signal output circuit 40 operates in response to the booster voltage VCP output from the charge pump circuit 39 and generates a gate control signal VG according to the electrical signal from the protection circuit 24 (more specifically, overcurrent protection circuit 34). The gate control signal VG is input to the gate of the power MISFET 9 and the gate of the sensor MISFET 21 through the gate control wiring 17. The sensor MISFET 21 and the power MISFET 9 are controlled at the same time by the gate control circuit 25.

The active clamp circuit 26 protects the power MISFET 9 from back electromotive force. The active clamp circuit 26 is connected to the drain electrode 11, the gate of the power MISFET 9, and the gate of the sensor MISFET 21. The active clamp circuit 26 may include a plurality of diodes.

The active clamp circuit 26 may include a plurality of diodes in forward-biased connection. The active clamp circuit 26 may include a plurality of diodes in reverse-biased connection. The active clamp circuit 26 may include a plurality of diodes in forward-biased connection and a plurality of didoes in reverse-biased connection.

The plurality of diodes may include a pn junction diode or a Zener diode or may include a pn junction diode and a Zener diode. The active clamp circuit 26 may include a plurality of Zener diodes in biased connection. The active clamp circuit 26 may include a Zener diode and a pn junction diode in reverse-biased connection.

The current detection circuit 27 detects a current flowing through the power MISFET 9 and the sensor MISFET 21. The current detection circuit 27 is connected to the protection circuit 24, the abnormality detection circuit 29, the source of the power MISFET 9, and the source of the sensor MISFET 21. The current detection circuit 27 generates a current detection signal according to an electrical signal (=output current IOUT) generated by the power MISFET 9 and an electrical signal (=sense current exhibiting a behavior same as that of the output current IOUT) generated by the sensor MISFET 21. The current detection signal is input to the abnormality detection circuit 29.

The power supply reverse connection protection circuit 28 protects the current-voltage control circuit 23, the power MISFET 9, and other elements from a reverse voltage when the DC power supply 2 is reversely connected. The power supply reverse connection protection circuit 28 is connected to the reference voltage electrode 14 and the current-voltage control circuit 23.

The abnormality detection circuit 29 monitors a voltage of the protection circuit 24. The abnormality detection circuit 29 is connected to the current-voltage control circuit 23, the protection circuit 24, and the current detection circuit 27. When there is an abnormality (such as voltage fluctuation) in one of the overcurrent protection circuit 34, the load open detection circuit 35, the overheat protection circuit 36, and the low voltage malfunction suppression circuit 37, the abnormality detection circuit 29 generates an abnormality detection signal corresponding to the voltage of the protection circuit 24 and outputs the abnormality detection signal to the outside.

More specifically, the abnormality detection circuit 29 includes a first multiplexer circuit 41 and a second multiplexer circuit 42. The first multiplexer circuit 41 includes two input parts, one output part, and one selection control input part. The protection circuit 24 and the current detection circuit 27 are connected to the respective input parts of the first multiplexer circuit 41. The second multiplexer circuit 42 is connected to the output part of the first multiplexer circuit 41. The current-voltage control circuit 23 is connected to the selection control input part of the first multiplexer circuit 41.

The first multiplexer circuit 41 generates an abnormality detection signal according to an electrical signal from the current-voltage control circuit 23, a voltage detection signal from the protection circuit 24, and a current detection signal from the current detection circuit 27. The abnormality detection signal generated by the first multiplexer circuit 41 is input to the second multiplexer circuit 42.

The second multiplexer circuit 42 includes two input parts and one output part. The output part of the first multiplexer circuit 41 and the enable electrode 15 are connected to the respective input parts of the second multiplexer circuit 42.

The sense electrode 16 is connected to the output part of the second multiplexer circuit 42.

When the MCU is connected to the enable electrode 15 and the resistor for pull-up or pull-down is connected to the sense electrode 16, an on signal is input from the MCU to the enable electrode 15, and the abnormality detection signal is extracted from the sense electrode 16. The resistor connected to the sense electrode 16 converts the abnormality detection signal into an electrical signal. A state abnormality of the semiconductor device 1 is detected based on the electrical signal.

Examination of Gate Control between Different Voltage Domains

An on-resistance of an N-channel MISFET is substantially two to three times better (on-resistance is lower) than an on-resistance of a P-channel MISFET with the same element area. In view of this, the N-channel MISFET is preferentially used as a power supply switch element (for example, high side switch element). However, a positive gate-source voltage may need to be applied to the N-channel MISFET to completely put the N-channel MISFET into the on-state. Therefore, a circuit that generates a booster voltage higher than the power supply voltage (for example, battery voltage), such as a relatively inexpensive charge pump circuit, is often built in the semiconductor device. Particularly, the charge pump circuit and other floating power supply circuits are integrated in the IPD that handles a large current and a high voltage, and the N-channel MISFET with a vertical structure is appropriately controlled.

Incidentally, a low breakdown voltage device (for example, breakdown voltage of 5 V) and a high breakdown voltage device (for example, breakdown voltage of 40 V) are combined and monolithically implemented in almost all semiconductor devices. The high breakdown voltage device can be used to improve voltage robustness of the semiconductor device. However, in view of reducing cost of the entire system, it is desirable to minimize the use of the high breakdown voltage device and to use the low breakdown voltage device as much as possible.

In this way, a level shifter may generally be necessary to transmit an internal signal between different voltage domains (between low potential system and high potential system) in the semiconductor device including both the low breakdown voltage device and the high breakdown voltage device. This will specifically be described with reference to the drawings.

Gate Control Circuit (Comparison Example)

Figure 3:
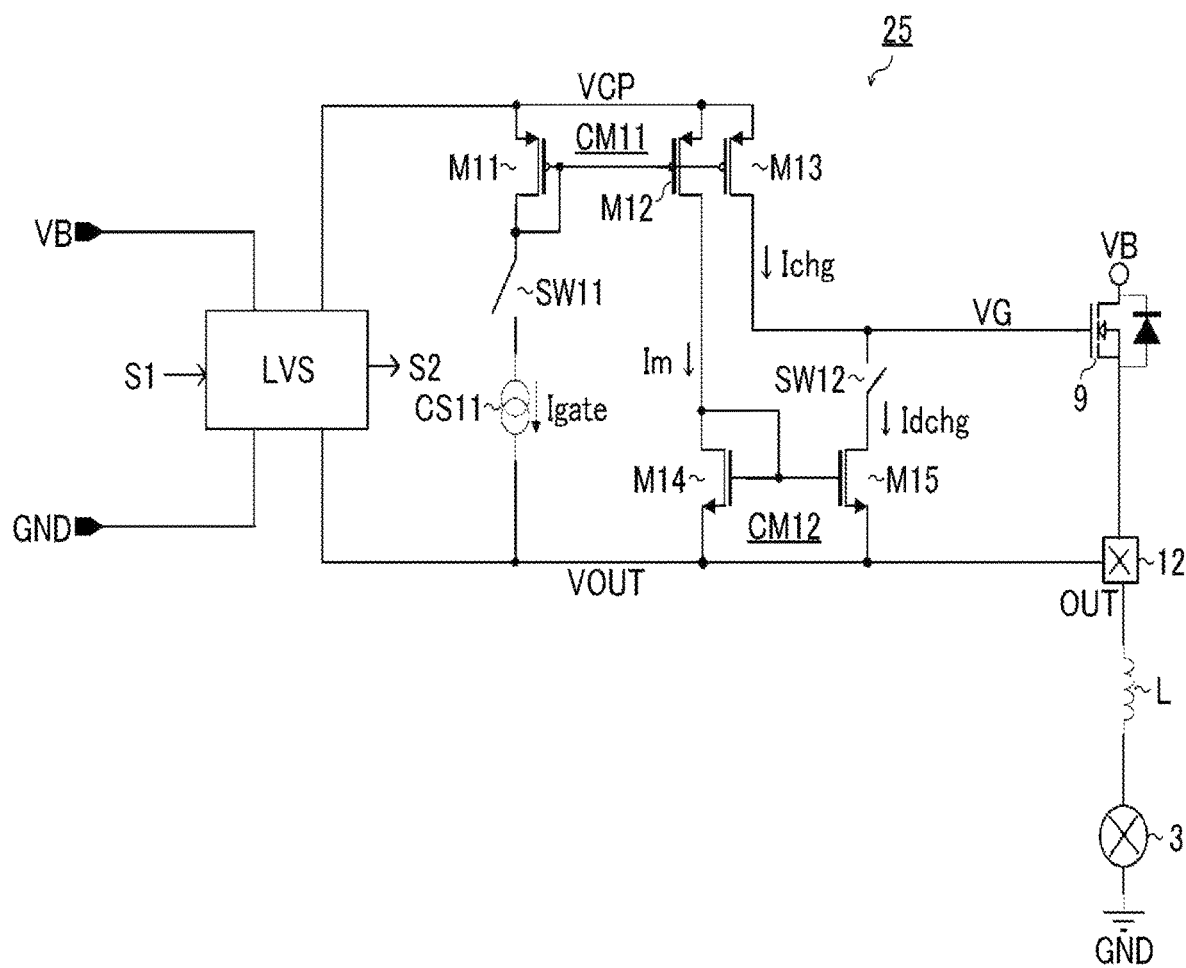
FIG. 3 depicts a comparison example of a gate control circuit.

FIG. 3 depicts a comparison example (=general configuration compared with various embodiments described later) of the gate control circuit 25. The gate control circuit 25 of the present comparison example includes a level shifter LVS, transistors M11 to M13 (for example, P-channel MISFETs), transistors M14 and M15 (for example, N-channel MISFETs), a current source CS11, and switches SW11 and SW12.

The level shifter LVS receives input of an input control signal S1 from the current-voltage control circuit 23 to generate a switch control signal S2 and outputs the switch control signal S2 to the switches SW11 and SW12.

The input control signal S1 is a logic signal of a low potential system (VB/GND domain) pulsed between the power supply voltage VB and the ground voltage GND. For example, the input control signal S1 enters a high level (=VB) when the input signal IN is in a high level (=logic level for putting the power MISFET 9 into the on-state) and enters a low level (=GND) when the input signal IN is in a low level (=logic level for putting the power MISFET 9 into the off-state). That is, the input control signal S1 corresponds to an on/off control signal of the power MISFET 9.

On the other hand, the switch control signal S2 is a logic signal of a high potential system (VCP/VOUT domain) pulsed between the booster voltage VCP and the output voltage VOUT. For example, the switch control signal S2 enters a high level (=VCP) when the input control signal S1 is in the high level (=logic level for putting the power MISFET 9 into the on-state) and enters a low level (=VOUT) when the input control signal S1 is in the low level (=logic level for putting the power MISFET 9 into the off-state). Note that the switch control signal S2 is used as an on/off control signal of the switches SW11 and SW12.

Sources of the transistors M11 to M13 are each connected to an application end of the booster voltage VCP. Gates of the transistors M11 to M13 are each connected to a drain of the transistor M11. The transistors M11 to M13 connected in this way function as a current mirror CM11 that mirrors a reference current Igate input to the drain of the transistor M11 and that outputs a mirror current Im and a gate charge current Ichg from drains of the transistors M12 and M13, respectively.

Sources of the transistors M14 and M15 are each connected to an application end of the output voltage VOUT. Gates of the transistors M14 and M15 are each connected to a drain of the transistor M14. The drain of the transistor M14 is connected to the drain of the transistor M12. The transistors M14 and M15 connected in this way function as a current mirror CM12 that mirrors the mirror current Im input to the drain of the transistor M14 and that outputs a gate discharge current Idchg from a drain of the transistor M15.

A first end of the switch SW11 is connected to the drain of the transistor M11. A second end of the switch SW11 is connected to a first end of the current source CS11. A second end of the current source CS11 is connected to the application end of the output voltage VOUT. The drain of the transistor M13 and a first end of the switch SW12 are each connected to the gate of the power MISFET 9. A second end of the switch SW12 is connected to the drain of the transistor M15.

The current source CS11 generates the reference current Igate. Note that the current source CS11 is generally implemented as a current mirror that receives input of a current as a source of the reference current Igate from the low potential system (VB-GND system).

When the switch control signal S2 is in the high level (=logic level for putting the power MISFET 9 into the on-state), the switch SW11 enters an on-state, and the switch SW12 enters an off-state. As a result, a gate capacitance (not illustrated) of the power MISFET 9 is charged by the gate charge current Ichg. Therefore, the gate control signal VG rises to a high level (=VCP), and the power MISFET 9 enters the on-state.

On the other hand, when the switch control signal S2 is in the low level (=logic level for putting the power MISFET 9 into the off-state), both of the switches SW11 and SW12 enter the on-state. As a result, the gate capacitance (not illustrated) of the power MISFET 9 is discharged by the gate discharge current Idchg (where Idchg>Ichg). Therefore, the gate control signal VG falls to a low level (=VOUT), and the power MISFET 9 enters the off-state.

Incidentally, when, for example, the semiconductor device 1 is an in-vehicle IPD connected to a battery, the output voltage VOUT may be in a wide operation range from a positive voltage (for example, +several dozen V) to a negative voltage (for example, −several dozen V). In this case, a problem arises when a level of an internal signal (current signal or voltage signal) of the semiconductor device 1 is shifted from the low potential system (VB/GND domain) to the high potential system (VCP-VOUT).

As described above, both the low breakdown voltage device and the high breakdown voltage device are incorporated into the semiconductor device 1. The booster voltage VCP is a voltage higher than the power supply voltage VB, and the booster voltage VCP is clamped to a voltage higher by a predetermined value (for example, 5 V) than the output voltage VOUT in most cases. Note that, when the power MISFET 9 is in the on-state, the gate capacitance (not illustrated) of the power MISFET 9 may need to be charged by the gate charge current Ichg from the charge pump circuit 39.

On the other hand, the output voltage VOUT may need to be raised to a voltage substantially equal to the power supply voltage VB (=within several mV from the power supply voltage VB) when the power MISFET 9 is in the on-state. However, in the case of VOUT≈VB, a headroom voltage for appropriate function of the level shifter LVS becomes insufficient. Specifically, there is not sufficient allowance for the headroom voltage for turning on/off the switch SW11 or SW12 or for the headroom voltage for the current source CS11 to generate the reference current Igate.

Note that a depletion N-channel MISFET with short-circuited gate and source can be used as the current source CS11 to easily secure the allowance for the headroom voltage. However, characteristic variations (such as temperature characteristics and manufacturing variations) are significantly large (for example, ±50% or more when all characteristic variations are combined) in the depletion N-channel MISFET. Therefore, it is difficult to highly accurately control a slew rate during on-transition of the power MISFET 9, and it is difficult to attain both improvement in electromagnetic compatibility (EMC) and reduction in power consumption.

In addition, it is difficult to apply the reference current Igate when the output voltage VOUT is a negative voltage (<GND) due to the function of the active clamp circuit 26. Therefore, appropriate gate control is difficult in an application that repeats the on/off control of the power MISFET 9 at high speed.

In view of the above examination, a first embodiment of the gate control circuit 25 that can perform appropriate gate control between different voltage domains is proposed below.

Gate Control Circuit (First Embodiment)

Figure 4:
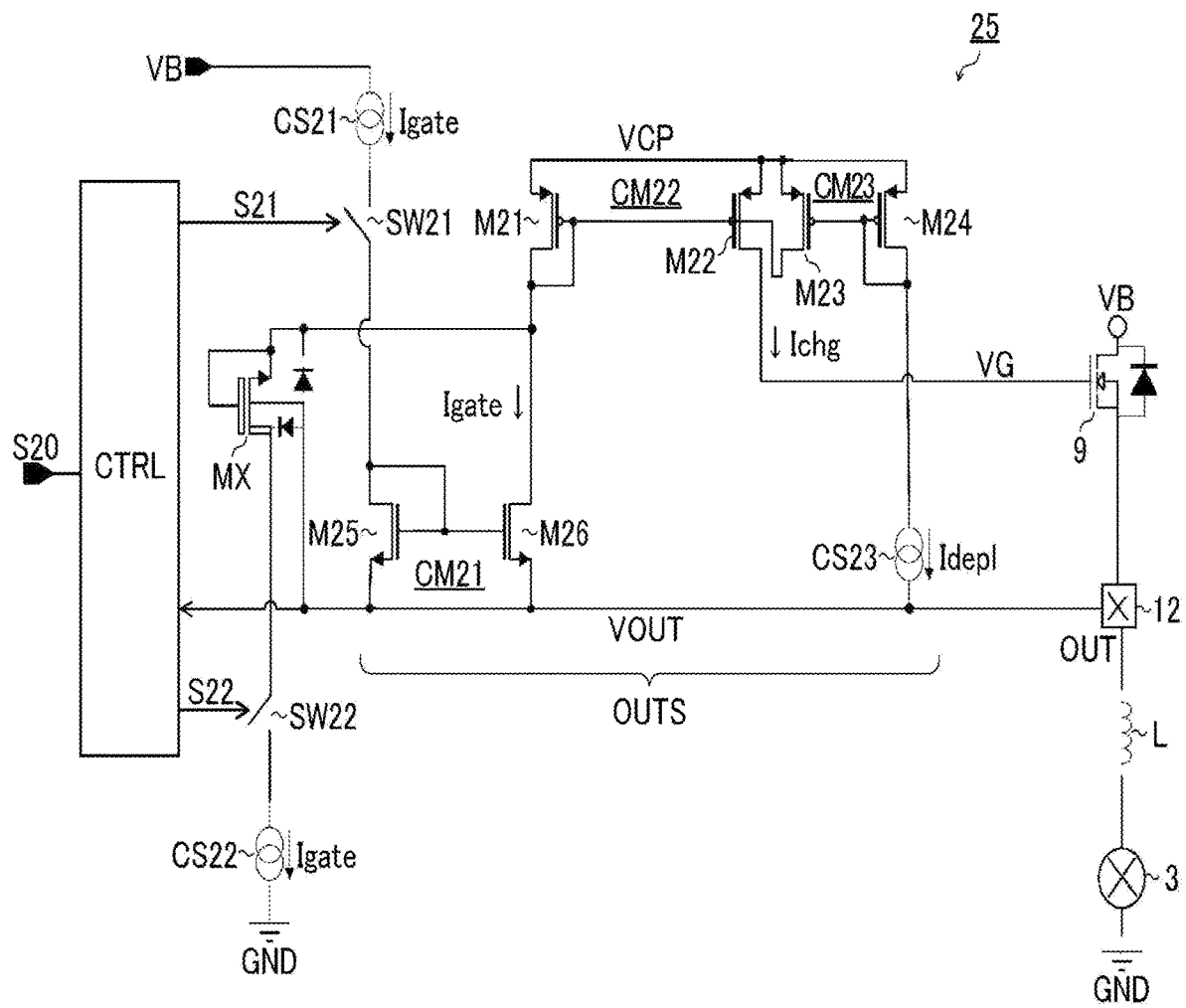
FIG. 4 depicts a first embodiment of the gate control circuit.

FIG. 4 depicts the first embodiment of the gate control circuit 25. The gate control circuit 25 of the first embodiment is a circuit block that generates the gate control signal VG of the power MISFET 9 connected between an application end of the power supply voltage VB and an application end of the output voltage VOUT, and the gate control circuit 25 includes a controller CTRL, an output stage OUTS, current sources CS21 and CS22, switches SW21 and SW22, and a backflow prevention element MX (for example, high breakdown voltage N-channel MISFET).

The controller CTRL receives input of an input control signal S20 from the current-voltage control circuit 23 to generate switch control signals S21 and S22 and outputs the switch control signals S21 and S22 to the switches SW21 and SW22, respectively.

The input control signal S20 is a logic signal of the low potential system (VB/GND domain) pulsed between the power supply voltage VB and the ground voltage GND. For example, the input control signal S20 enters a high level (=VB) when the input signal IN is in the high level (=logic level for putting the power MISFET 9 into the on-state) and enters a low level (=GND) when the input signal IN is in the low level (=logic level for putting the power MISFET 9 into the off-state). That is, the input control signal S1 corresponds to the on/off control signal of the power MISFET 9.

The switch control signal S21 is a logic signal of a low potential system (VB/VBM5 domain) pulsed between the power supply voltage VB and a first intermediate voltage VBM5 (=VB−5 V). The switch control signal S21 enters a low level (=VBM5) when, for example, the input control signal S20 is in the high level (=logic level for putting the power MISFET 9 into the on-state) and the output voltage VOUT is lower than a threshold voltage Vth (for example, first intermediate voltage VBM5). The switch control signal S21 enters a high level (=VB) when, for example, the input control signal S20 is in the high level and the output voltage VOUT is higher than the threshold voltage Vth. Note that the switch control signal S21 corresponds to an on/off control signal of the switch SW21.

The switch control signal S22 is a logic signal of a low potential system (VREF/GND domain) pulsed between a second intermediate voltage VREF (=5 V) and the ground voltage GND. The switch control signal S22 enters a low level (=GND) when, for example, the input control signal S20 is in the high level and the output voltage VOUT is lower than the threshold voltage Vth. The switch control signal S22 enters a high level (=VREF) when, for example, the input control signal S20 is in the high level and the output voltage VOUT is higher than the threshold voltage Vth. Note that the switch control signal S22 corresponds to an on/off control signal of the switch SW22.

A magnitude relation of GND<VREF≤VBM5<VB holds between the power supply voltage VB, the first intermediate voltage VBM5, the second intermediate voltage VREF, and the ground voltage GND.

In this way, in charging the gate capacitance of the power MISFET 9, the controller CTRL exclusively (complementarily) turns on/off the switches SW21 and SW22 according to the output voltage VOUT to thereby switch which one of the current sources CS21 and CS22 is to be used in the output stage OUTS (details will be described later).

The current source CS21 is connected between the application end of the power supply voltage VB and the application end of the output voltage VOUT, and the current source CS21 generates a reference current Igate on a source side flowing from the application end of the power supply voltage VB toward the output stage OUTS.

The current source CS22 is connected between an application end of the booster voltage VCP and an application end of the ground voltage GND, and the current source CS22 generates a reference current Igate on a sink side flowing from the output stage OUTS toward the application end of the ground voltage GND. Note that the booster voltage VCP is raised to a voltage value higher than the power supply voltage VB in a steady state of the semiconductor device 1.

The switch SW21 is connected between the current source CS21 and the output stage OUTS (in FIG. 4, drain of transistor M25 described later), and the switch SW21 is turned on/off according to the switch control signal S21. The switch SW21 enters an on-state when the switch control signal S21 is in the low level (=VB) and enters an off-state when the switch control signal S21 is in the high level (=VBM5), for example.

The switch SW22 is connected between the current source CS22 and the output stage OUTS (in FIG. 4, drain of transistor M21 described later), and the switch SW22 is turned on/off according to the switch control signal S22. The switch SW22 enters an on-state when the switch control signal S22 is in the high level (=VREF) and enters an off-state when the switch control signal S22 is in the low level (=GND), for example.

The backflow prevention element MX is connected between the switch SW22 and the output stage OUTS (in FIG. 4, drain of transistor M21 described later), and the backflow prevention element MX cuts off a current backflow path from the application end of the output voltage VOUT when the output voltage VOUT falls below the ground voltage GND.

A source of the backflow prevention element MX is connected to the output stage OUTS (in FIG. 4, drain of transistor M21 described later). A drain of the backflow prevention element MX is connected to the switch SW22. Note that the backflow prevention element MX has short-circuited gate and source.

Next, a parasitic element accompanying the backflow prevention element MX will be described. When the backflow prevention element MX is formed on a P-type semiconductor substrate, the backflow prevention element MX is accompanied by a body diode, with the back gate of the backflow prevention element MX as an anode and the source and the drain of the backflow prevention element MX as cathodes. Note that, when the power MISFET 9 has a vertical structure, the P-type semiconductor substrate is electrically connected to the application end of the output voltage VOUT (=source electrode 12).

Therefore, the body diode accompanying the backflow prevention element MX is reverse biased when the output voltage VOUT is lower than the ground voltage GND (for example, during active clamp operation). This allows the current backflow path from the application end of the output voltage VOUT to be cut off when the output voltage VOUT falls below the ground voltage GND.

The output stage OUTS is a circuit block that uses one of the current sources CS21 and CS22 to generate a gate charge current Ichg for charging the gate capacitance of the power MISFET 9, and the output stage OUTS includes transistors M21 to M24 (for example, P-channel MISFETs), transistors M25 and M26 (for example, N-channel MISFETs), and a current source CS23.

Sources of the transistors M25 and M26 are each connected to the application end of the output voltage VOUT. Gates of the transistors M25 and M26 are each connected to the drain of the transistor M25. The drain of the transistor M25 is connected to the current source CS21 through the switch SW21. The transistors M25 and M26 connected in this way function as a current mirror CM21 that mirrors, to a drain of the transistor M26, the reference current Igate input to the drain of the transistor M25.

Sources of the transistors M21 and M22 are each connected to the application end of the booster voltage VCP. Gates of the transistors M21 and M22 are each connected to the drain of the transistor M21. The drain of the transistor M21 is connected to the drain of the transistor M26 and the source of the backflow prevention element MX. A drain of the transistor M22 is connected to the gate of the power MISFET 9. The transistors M21 and M22 connected in this way function as a current mirror CM22 that mirrors a reference current Igate input to the drain of the transistor M21 (=corresponding to the reference current input from one of the current sources CS21 and CS22) and that outputs the gate charge current Ichg from the drain of the transistor M22.

Sources of the transistors M23 and M24 are each connected to the application end of the booster voltage VCP. Gates of the transistors M23 and M24 are each connected to a drain of the transistor M24. The drain of the transistor M24 is connected to the current source CS23. A drain of the transistor M23 is connected to each of the gates of the transistors M21 and M22. The transistors M23 and M24 connected in this way function as a current mirror CM23 that mirrors, to the drain of the transistor M26, a depletion current Idepl input to the drain of the transistor M24.

The current source CS23 is connected between the drain of the transistor M24 and the application end of the output voltage VOUT, and the current source CS23 generates a small depletion current Idepl. Note that the current source CS23 may be, for example, a depletion N-channel MISFET with short-circuited gate and source.

Next, a high level transition operation (=charge operation of gate capacitance) of the gate control signal VG performed by the gate control circuit 25 of the present embodiment will be described in detail.

When the output voltage VOUT is lower than the threshold voltage Vth (=VMB5=VB−5 V), the switch SW21 enters the on-state, and the switch SW22 enters the off-state. As a result, the reference current Igate on the source side flowing from the application end of the power supply voltage VB toward the output stage OUTS through the current source CS21 and the switch SW21 is input to the output stage OUTS. The output stage OUTS uses the current mirrors CM21 and CM22 to mirror the reference current Igate to thereby output the gate charge current Ichg flowing from the application end of the booster voltage VCP toward the gate of the power MISFET 9. Therefore, the gate capacitance of the power MISFET 9 is charged, and the power MISFET 9 enters the on-state.

On the other hand, when the output voltage VOUT is higher than the threshold voltage Vth, the switch SW21 enters the off-state, and the switch SW22 enters the on-state. As a result, the reference current Igate on the sink side flowing from the output stage OUTS toward the application end of the ground voltage GND through the backflow prevention element MX, the switch SW22, and the current source CS22 is input to the output stage OUTS. The output stage OUTS uses the current mirror CM22 to mirror the reference current Igate and thereby output the gate charge current Ichg flowing from the application end of the booster voltage VCP toward the gate of the power MISFET 9. Therefore, the gate capacitance of the power MISFET 9 is charged, and the power MISFET 9 enters the on-state.

In this way, the gate control circuit 25 of the present embodiment does not require the level shifter LVS for delivering the voltage control signal between the low potential system (VB-GND domain) and the high potential system (VCP-VOUT domain), unlike the comparison example described above (FIG. 3). This allows appropriate gate control to be performed between different voltage domains without taking into account the headroom voltage of the level shifter LVS.

In addition, depletion N-channel MISFETs with inadequate accuracy do not have to be used as the current sources CS21 and CS22 in the gate control circuit 25 of the present embodiment. Therefore, the slew rate during on-transition of the power MISFET 9 can be controlled with high accuracy, and both the improvement in EMC and the reduction in power consumption can be attained.

In addition, the current mirror CM23 described above typically causes the small depletion current Idepl to flow from the application end of the booster voltage VCP toward the gates of the transistors M21 and M22 in the gate control circuit 25 of the present embodiment. Therefore, the gate-source voltage of the transistors M21 and M22 drops when the reference current Igate is not input to the current mirrors CM21 and CM22, and the current mirror CM22 completely enters a non-operation state. This can prevent unintended generation of the gate charge current Ichg when, for example, the power MISFET 9 is in the off-state.

Note that the depletion current Idepl generated by the current source CS23 is sufficiently smaller than the reference current Igate, and the depletion current Idepl does not affect accuracy of the gate charge current Ichg.

If a short circuit switch is provided between the gate and the source of the transistors M21 and M22, a level shifter for delivering a control signal of the short circuit switch between different voltage domains may be necessary, and the above-described issue of securing the headroom voltage arises again. On the other than, a control signal for completely putting the current mirror CM22 into the non-operation state is not necessary in the gate control circuit 25 of the present embodiment, and the level shifter does not have to be provided.

Gate Control Circuit (Second Embodiment)

Figure 5:
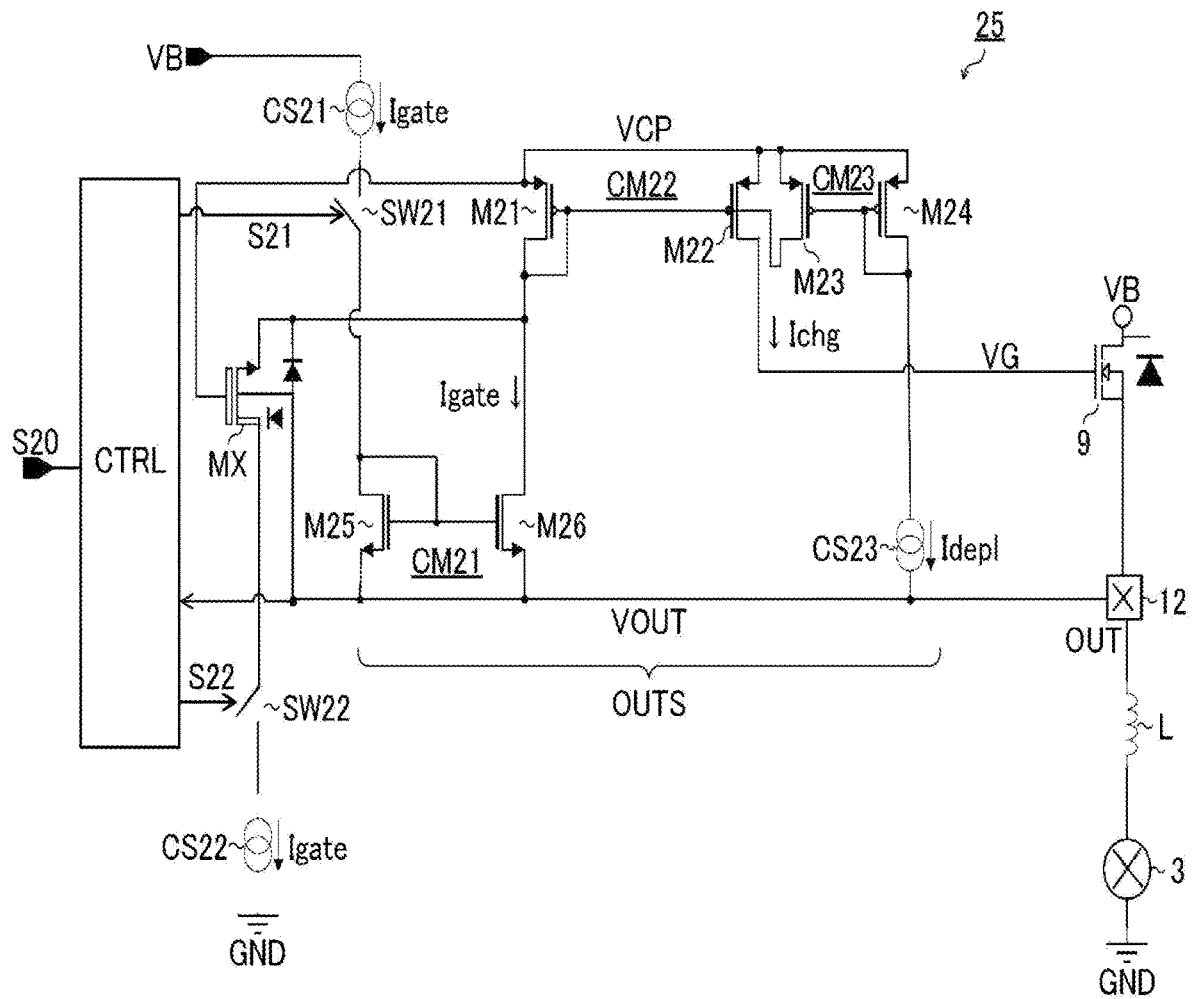
FIG. 5 depicts a second embodiment of the gate control circuit.

FIG. 5 depicts a second embodiment of the gate control circuit 25. While the gate control circuit 25 of the second embodiment is based on the first embodiment (FIG. 4), the gate of the backflow prevention element MX is connected to the source of the transistor M21 (=application end of booster voltage VCP) instead of the drain of the transistor M21.

This configuration can be adopted to secure a larger margin during the normal operation of the semiconductor device 1 and maintain the drain voltage of the backflow prevention element MX at a potential higher than the output voltage VOUT, while attaining effects similar to the effects of the first embodiment (FIG. 4).

That is, when the switch SW22 is in the on-state and the current source CS22 is used to generate the gate charge current Ichg, the drain voltage of the backflow prevention element MX is close to the gate voltage of the transistor M21.

Gate Control Circuit (Third Embodiment)

Figure 6:
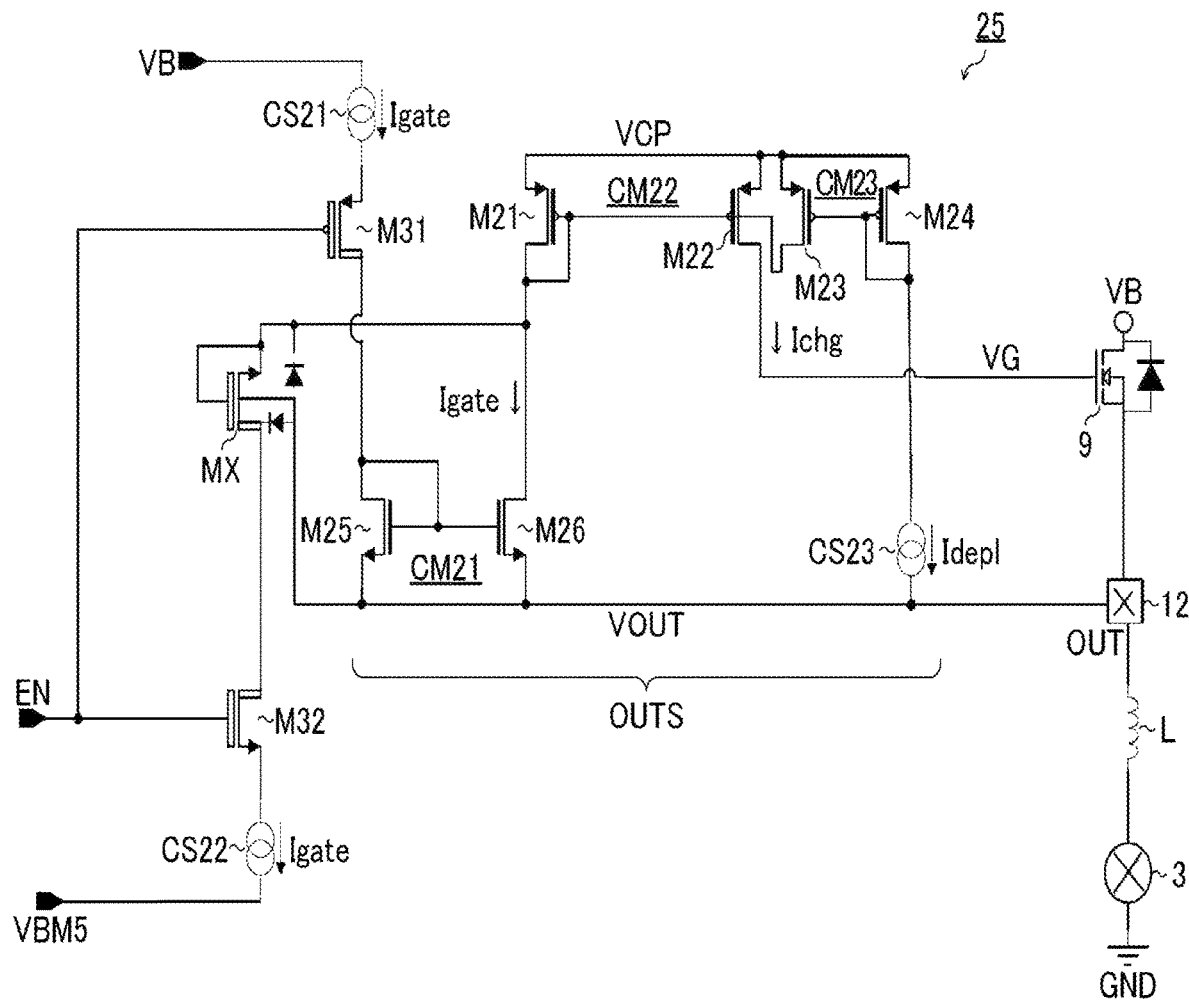
FIG. 6 depicts a third embodiment of the gate control circuit.

FIG. 6 depicts a third embodiment of the gate control circuit 25. While the gate control circuit 25 of the third embodiment is based on the second embodiment (FIG. 5), a transistor M31 (for example, high breakdown voltage P-channel MISFET) and a transistor M32 (for example, high breakdown voltage N-channel MISFET) are used as the switches SW21 and SW22, respectively. In addition, the current source CS22 is connected between the application end of the booster voltage VCP and a reference voltage VBM5 (=replacing the first intermediate voltage VBM5 described earlier). Furthermore, a single switch control signal EN is used in place of the switch control signals S21 and S22 described earlier. The description of the constituent elements already mentioned above will not be repeated, and the features of the present embodiment will be described in detail.

A source of the transistor M31 is connected to the current source CS21. A drain of the transistor M31 is connected to the drain of the transistor M25. A gate of the transistor M31 is connected to an application end of the switch control signal EN. The transistor M31 enters an on-state when the switch control signal EN is in a low level (=VBM5) and enters the off-state when the switch control signal EN is in a high level (=VB).

A drain of the transistor M32 is connected to the drain of the backflow prevention element MX. A source of the transistor M32 is connected to the current source CS22. A gate of the transistor M32 is connected to the application end of the switch control signal EN. The transistor M32 enters an on-state when the switch control signal EN is in the high level (=VB) and enters an off-state when the switch control signal EN is in the low level (=VBM5).

Note that the switch control signal EN may be generated by, for example, a comparator (not illustrated) that monitors a drain-source voltage Vds of the power MISFET 9. However, the generation method of the switch control signal EN is not limited to this in any way, and other generation methods may be adopted.

Figure 7:
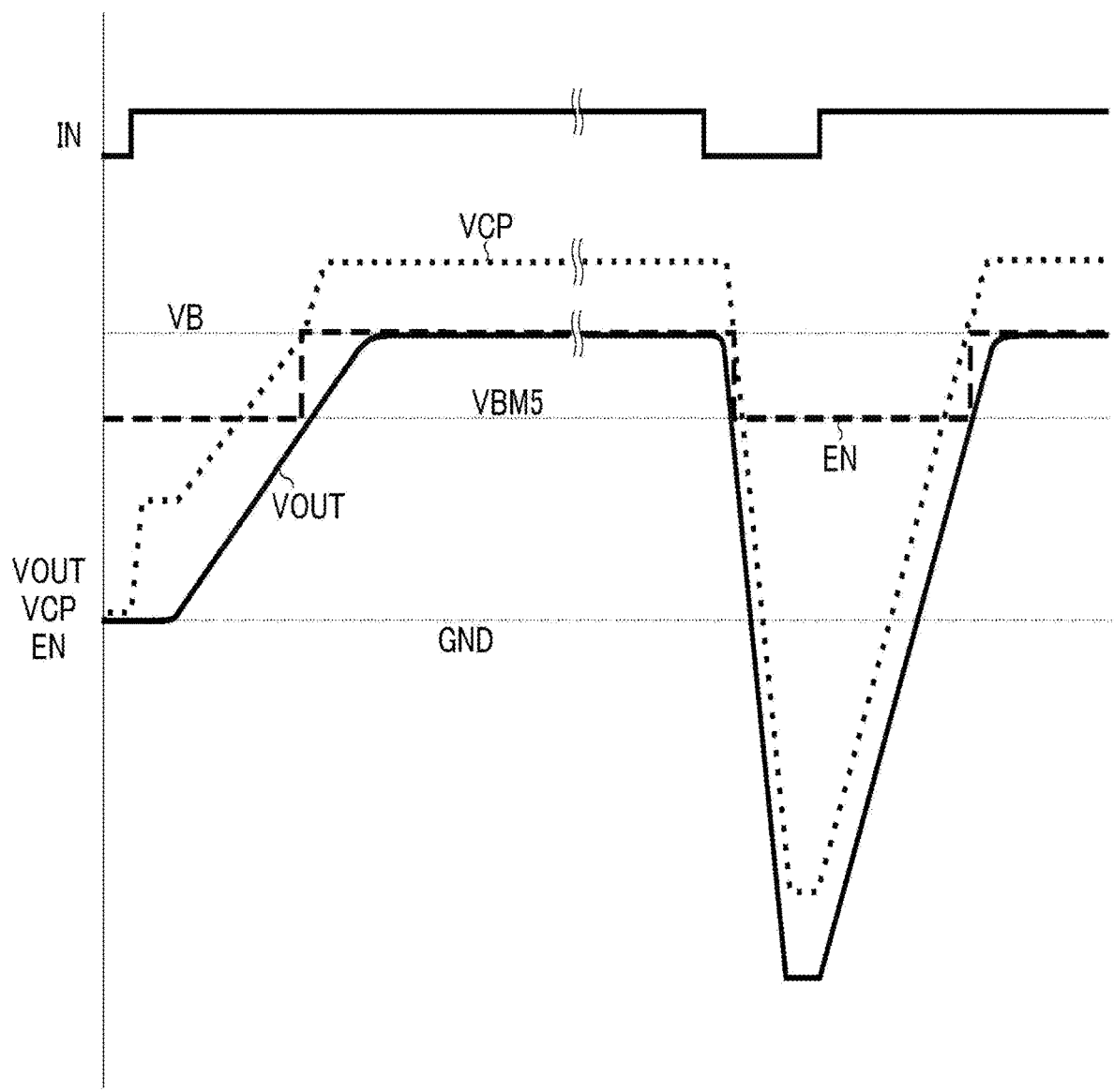
FIG. 7 depicts signal waveforms of parts of the gate control circuit.

FIG. 7 depicts signal waveforms of parts of the gate control circuit 25 in the third embodiment. An upper part of FIG. 7 depicts the input signal IN, and a lower part of FIG. 7 depicts the output voltage VOUT (solid line), the booster voltage VCP (small dashed line), and the switch control signal EN (large dashed line).

The booster voltage VCP generated by the charge pump circuit 39 typically exceeds the output voltage VOUT by a predetermined value (=voltage value defined by internal clamp or other adjustment structures, which is, for example, approximately 5 V).

The output voltage VOUT is low immediately after the input signal IN is raised to the high level, and there is a sufficient allowance for the headroom voltage. Therefore, the switch control signal EN enters the low level (=VBM5). In this case, the transistor M31 enters the on-state, and the transistor M32 enters the off-state. As a result, the current source CS21 provided between the application end of the power supply voltage VB and the output stage OUTS can be used to supply the reference current Igate on the source side to the output stage OUTS.

Note that the threshold voltage Vth for determining whether or not the output voltage VOUT is low can be, for example, the reference voltage VBM5. Obviously, the threshold voltage Vth is not limited to this in any way, and any other internal floating voltages may be used.

Subsequently, when the output voltage VOUT exceeds the threshold voltage Vth (=reference voltage VBM5), the switch control signal EN enters the high level (=VB). In this case, the transistor M31 enters the off-state, and the transistor M32 enters the on-state. Therefore, the current source CS22 provided between the output stage OUTS and the application end of the reference voltage VBM5 can be used to supply the reference current Igate on the sink side to the output stage OUTS.

Further, when the input signal IN falls to the low level and the active clamp circuit 26 is activated, the output voltage VOUT falls below the ground voltage GND. In this case, the drain-source voltage Vds of the power MISFET 9 obviously becomes higher than VB−VBM5 (=5 V). Therefore, the switch control signal EN enters the low level. The transistor M31 enters the on-state, and the transistor M32 enters the off-state. This state is none other than the state in which there is a sufficient allowance for the headroom voltage as described above.

Therefore, for example, even an application that repeats the on/off control of the power MISFET 9 at high speed can also perform appropriate gate control, and the application can respond to a difficult request of a customer.

Gate Control Circuit (Fourth Embodiment)

FIG. 8 depicts a fourth embodiment of the gate control circuit 25. While the gate control circuit 25 of the fourth embodiment is based on the third embodiment (FIG. 6), the gate of the backflow prevention element MX is connected to the source of the transistor M21 (=application end of booster voltage VCP) instead of the drain of the transistor M21.

This configuration can be adopted to secure a larger margin during the normal operation of the semiconductor device 1 and maintain the drain voltage of the backflow prevention element MX at a potential higher than the output voltage VOUT, while attaining effects similar to the effects of the third embodiment (FIG. 6).

That is, when the switch SW22 is in the on-state and the current source CS22 is used to generate the gate charge current Ichg, the drain voltage of the backflow prevention element MX is close to the gate voltage of the transistor M21. These features are similar to the features of the second embodiment (FIG. 5).

Gate Control Circuit (Fifth Embodiment)

Figure 9:
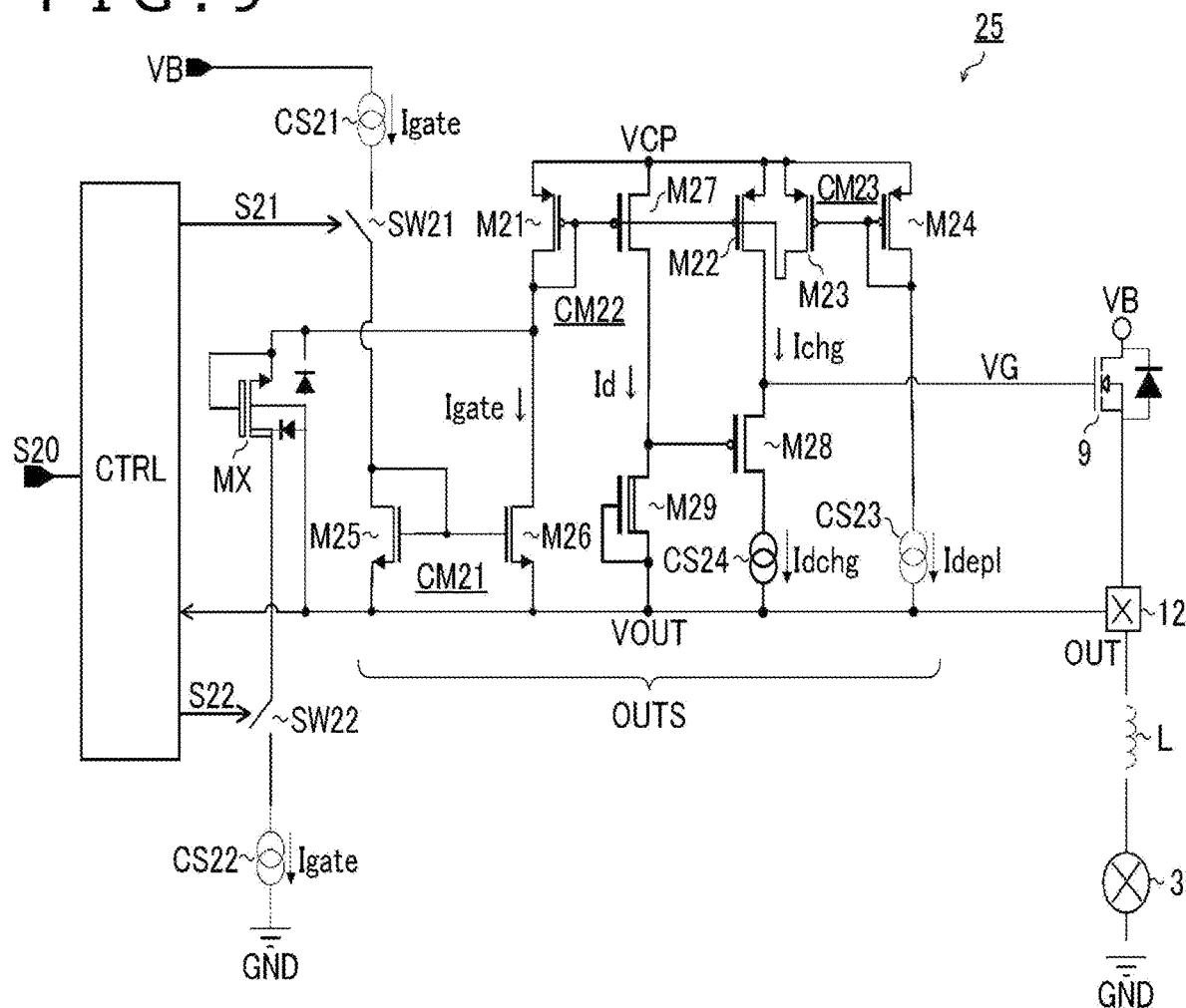
FIG. 9 depicts a fifth embodiment of the gate control circuit.

FIG. 9 depicts a fifth configuration of the gate control circuit 25. While the gate control circuit 25 of the fifth embodiment is based on the first embodiment (FIG. 4), transistors M27 and M28 (for example, P-channel MISFETs), a transistor M29 (for example, depletion N-channel MISFET), and a current source CS24 are added as constituent elements of the output stage OUTS.

A source of the transistor M27 is connected to the application end of the booster voltage VCP. A gate of the transistor M27 is connected to the gate of the transistor M21. A drain of the transistor M27 is connected to a gate of the transistor M28 and a drain of the transistor M29.

The transistor M27 connected in this way functions as part of the current mirror CM22 described above, and the transistor M27 mirrors, as a drain current Id of the transistor M27, the reference current Igate flowing through the drain of the transistor M21.

A source of the transistor M28 is connected to the gate of the power MISFET 9. A drain of the transistor M28 is connected to a first end of the current source CS24. A second end of the current source CS24 and a gate and a source of the transistor M29 are each connected to the application end of the output voltage VOUT.

Note that the current source CS24 generates a predetermined gate discharge current Idchg. The transistor M29 functions as a logic fixation element for pulling down the gate voltage of the transistor M28 to a low level (=VOUT) when the drain current Id is not flowing.

In the gate control circuit 25 of the present embodiment, the switch SW21 or SW22 enters the on-state in charging the gate capacitance of the power MISFET 9 as described above. Therefore, the reference current Igate is input to the output stage OUTS, and the gate charge current Ichg is supplied to the gate of the power MISFET 9. In this case, the drain current Id flows through the transistor M27, and the gate voltage of the transistor M28 enters a high level. Therefore, the transistor M28 enters an off-state. This cuts off the gate of the power MISFET 9 and the current source CS24. Therefore, the gate discharge current Idchg is not pulled out from the gate of the power MISFET 9.

On the other hand, for example, both of the switches SW21 and SW22 enter the off-state in discharging the gate capacitance of the power MISFET 9. Therefore, the reference current Igate is not input to the output stage OUTS. The current mirror CM22 enters the non-operation state, and the gate charge current Ichg is not supplied to the gate of the power MISFET 9. In this case, the drain current Id of the transistor M27 does not flow either. The gate voltage of the transistor M28 is pulled down to the low level, and the transistor M28 enters the on-state. As a result, the gate of the power MISFET 9 and the current source CS24 are electrically connected, and the gate discharge current Idchg is pulled out from the gate of the power MISFET 9.

In this way, the output stage OUTS in the gate control circuit 25 of the present embodiment has the function of generating the gate discharge current Idchg for discharging the gate capacitance of the power MISFET 9 when the reference current Igate is not input to the current mirror CM22. Therefore, topology described above can be applied not only to the turn-on phase of the power MISFET 9 but also to the turn-off phase.

Modification

Although which one of the current sources CS21 and CS22 is to be used for the gate charge of the power MISFET 9 is switched in the examples described in the first to fifth embodiments, the controller CTRL may use at least one of the current sources CS21 and CS22 according to the output voltage. That is, both of the current sources CS21 and CS22 may be used for the gate charge of the power MISFET 9.

Application to Vehicle

Figure 10:
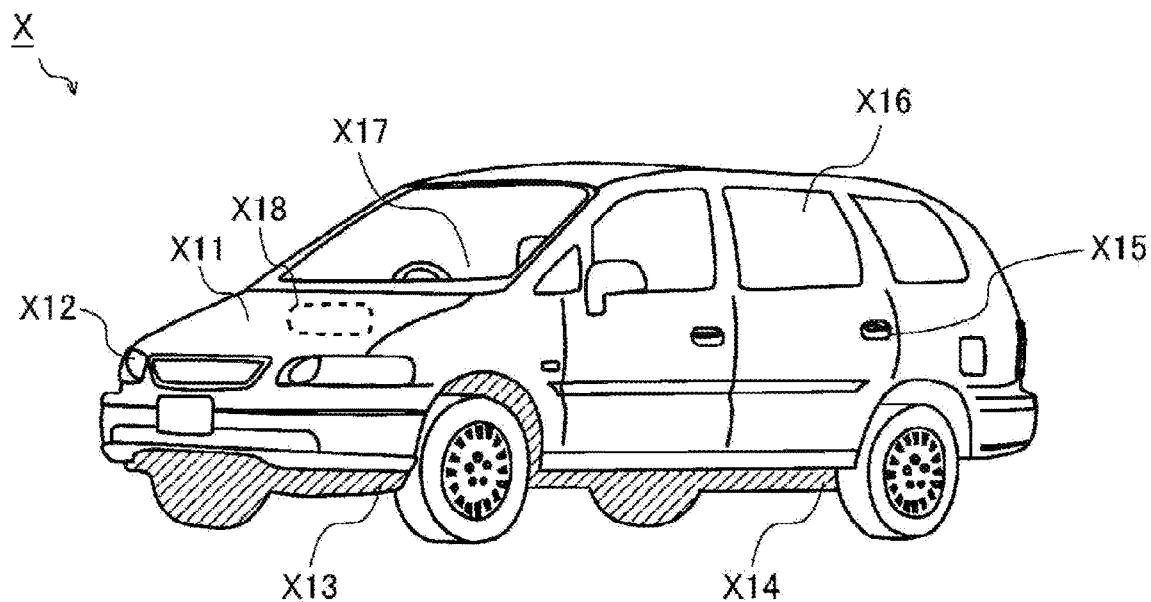
FIG. 10 is an external view illustrating a configuration example of a vehicle.

FIG. 10 is an external view illustrating a configuration example of a vehicle X. The vehicle X of the present configuration example is provided with a battery (not illustrated in FIG. 10) and various electronic apparatuses X11 to X18 that receive power from the battery to operate.

Examples of the vehicle X include an engine vehicle as well as an electric vehicle (xEV such as battery electric vehicle (BEV), hybrid electric vehicle (HEV), plug-in hybrid electric vehicle/plug-in hybrid vehicle (PHEV/PHV), or fuel cell electric vehicle/fuel cell vehicle (FCEV/FCV)).

Note that installation positions of the electronic apparatuses X11 to X18 in FIG. 10 may be different from actual positions for the convenience of illustration.

The electronic apparatus X11 is an electronic control unit that performs control related to an engine (such as injection control, electronic throttle control, idling control, oxygen sensor heater control, and auto cruise control) or control related to a motor (such as torque control and power regeneration control).

The electronic apparatus X12 is a lamp control unit that performs light on/off control of a high intensity discharged lamp (HID), a daytime running lamp (DRL), and other lamps.

The electronic apparatus X13 is a transmission control unit that performs control related to a transmission.

The electronic apparatus X14 is a control unit that performs control related to motion of the vehicle X (such as anti-lock brake system (ABS) control, electric power steering (EPS) control, and electronic suspension control).

The electronic apparatus X15 is a security control unit that controls drive of a door lock, a security alarm, and other systems.

The electronic apparatus X16 is an electronic apparatus incorporated into the vehicle X at the factory shipment as standard equipment or a manufacturer option, such as a wiper, an electric door mirror, a power window, a damper (shock absorber), an electric sunroof, and an electric seat.

The electronic apparatus X17 is an electronic apparatus optionally mounted on the vehicle X as a user option, such as an in-vehicle audio/visual (A/V) apparatus, a car navigation system, and an electronic toll collection system (ETC).

The electronic apparatus X18 is an electronic apparatus including a high breakdown voltage motor, such as an in-vehicle blower, an oil pump, a water pump, and a battery cooling fan.

Note that the electronic apparatus A described above can be understood as the electronic apparatuses X11 to X18. That is, the semiconductor device 1 described above can be incorporated into any of the electronic apparatuses X11 to X18.

Summarization

A summary of various embodiments described above will be described.

For example, a gate control circuit disclosed in the present specification generates a gate control signal of an output transistor connected between an application end of a power supply voltage and an application end of an output voltage, the gate control circuit including a first current source connected between the application end of the power supply voltage and the application end of the output voltage, a second current source connected between an application end of a booster voltage and an application end of a reference voltage, the booster voltage being raised to a voltage value higher than the power supply voltage in a steady state, an output stage that uses at least one of the first current source and the second current source to generate a gate charge current for charging a gate capacitance of the output transistor, and a controller that uses at least one of the first current source and the second current source according to the output voltage (first configuration).

The gate control circuit according to the first configuration may further include a first switch connected between the first current source and the output stage and a second switch connected between the second current source and the output stage, in which the controller turns on/off the first switch and the second switch according to the output voltage (second configuration).

In the gate control circuit according to the second configuration, the controller may receive input of an input control signal pulsed between the power supply voltage and the reference voltage, to generate a first switch control signal to be pulsed between the power supply voltage and a first intermediate voltage (where the first intermediate voltage<the power supply voltage) and to generate a second switch control signal to be pulsed between a second intermediate voltage and the reference voltage (where the reference voltage<the second intermediate voltage≤the first intermediate voltage), and may output the first switch control signal and the second switch control signal to the first switch and the second switch, respectively (third configuration).

In the gate control circuit according to the third configuration, the reference voltage<the second intermediate voltage≤the first intermediate voltage<the power supply voltage may hold (fourth configuration).

In the gate control circuit according to any one of the first to fourth configurations, the output stage may include a current mirror that mirrors a reference current input from one of the first current source and the second current source and generates the gate charge current (fifth configuration).

In the gate control circuit according to the fifth configuration, the output stage may have a function of putting the current mirror into a non-operation state when the reference current is not input to the current mirror (sixth configuration).

In the gate control circuit according to the fifth or sixth configuration, the output stage may have a function of generating a gate discharge current for discharging a gate of the output transistor when the reference current is not input to the current mirror (seventh configuration).

The gate control circuit according to any one of the first to seventh configurations may further include a backflow prevention element that cuts off a current backflow path from the application end of the output voltage when the output voltage falls below the reference voltage (eighth configuration).

For example, a semiconductor device disclosed in the present specification includes an output transistor connected between an application end of a power supply voltage and an application end of an output voltage, and the gate control circuit according to any one of the first to eighth configurations that generates a gate control signal of the output transistor (ninth configuration).

For example, an electronic apparatus disclosed in the present specification includes the semiconductor device according to the ninth configuration (tenth configuration).

For example, a vehicle disclosed in the present specification includes the electronic apparatus according to the tenth configuration (eleventh configuration).

Other Modifications

Various technical features disclosed in the present specification can be changed in various ways without departing from the scope of the embodiments and the technical creation of the embodiments. For example, mutual replacement of a bipolar transistor and a metal-oxide-semiconductor (MOS) field-effect transistor and logic level inversion of various signals can optionally be performed. That is, the embodiments are illustrative in all aspects and should not be construed as restrictive. The technical scope of the present technology is defined by the claims, and it should be understood that all changes within the meaning and range of equivalents of the claims be included in the technical scope of the present technology.

What is claimed is:

1. A gate control circuit that generates a gate control signal of an output transistor connected between an application end of a power supply voltage and an application end of an output voltage, the gate control circuit comprising:
    a first current source connected between the application end of the power supply voltage and the application end of the output voltage;
    a second current source connected between an application end of a booster voltage and an application end of a reference voltage, the booster voltage being raised to a voltage value higher than the power supply voltage in a steady state;
    an output stage that uses at least one of the first current source and the second current source to generate a gate charge current for charging a gate of the output transistor; and a controller that uses at least one of the first current source and the second current source according to the output voltage.

2. The gate control circuit according to claim 1, further comprising:

a first switch connected between the first current source and the output stage; and a second switch connected between the second current source and the output stage, wherein the controller turns on/off the first switch and the second switch according to the output voltage.

3. The gate control circuit according to claim 2, wherein the controller receives input of an input control signal pulsed between the power supply voltage and the reference voltage, to generate a first switch control signal to be pulsed between the power supply voltage and a first intermediate voltage and to generate a second switch control signal to be pulsed between a second intermediate voltage and the reference voltage, and outputs the first switch control signal and the second switch control signal to the first switch and the second switch, respectively.

4. The gate control circuit according to claim 3, wherein the reference voltage<the second intermediate voltage≤the first intermediate voltage<the power supply voltage holds.

5. The gate control circuit according to claim 1, wherein the output stage includes a current mirror that mirrors a reference current input from one of the first current source and the second current source and generates the gate charge current.

6. The gate control circuit according to claim 5, wherein the output stage has a function of putting the current mirror into a non-operation state when the reference current is not input to the current mirror.

7. The gate control circuit according to claim 5, wherein the output stage has a function of generating a gate discharge current for discharging the gate of the output transistor when the reference current is not input to the current mirror.

8. The gate control circuit according to claim 1, further comprising:

a backflow prevention element that cuts off a current backflow path from the application end of the output voltage when the output voltage falls below the reference voltage.

9. A semiconductor device comprising:

an output transistor connected between an application end of a power supply voltage and an application end of an output voltage; and the gate control circuit according to claim 1 that generates a gate control signal of the output transistor.

10. An electronic apparatus comprising:
the semiconductor device according to claim 9.

11. A vehicle comprising:
the electronic apparatus according to claim 10.

* * * * *